United States Patent [19]

Slawinski

[11] 4,444,605
[45] Apr. 24, 1984

[54] PLANAR FIELD OXIDE FOR SEMICONDUCTOR DEVICES

[75] Inventor: Christopher Slawinski, Katy, Tex.

[73] Assignee: Texas Instruments Incorporated, Dallas, Tex.

[21] Appl. No.: 412,324

[22] Filed: Aug. 27, 1982

[51] Int. Cl.³ .......................................... H01L 21/308
[52] U.S. Cl. ...................................... 148/187; 29/571; 29/576 W; 29/578
[58] Field of Search ..................... 29/571, 576 W, 578; 148/187

[56] References Cited

U.S. PATENT DOCUMENTS

| | | | |
|---|---|---|---|
| 4,002,511 | 1/1977 | Magdo et al. | 148/187 |
| 4,055,444 | 10/1977 | Rao | 148/187 X |
| 4,088,516 | 5/1978 | Kondo et al. | 148/187 |
| 4,104,086 | 8/1978 | Bondur et al. | 29/576 W |
| 4,187,125 | 2/1980 | Feist | 148/187 X |
| 4,199,378 | 4/1980 | van Gils | 148/187 X |
| 4,211,582 | 7/1980 | Horng et al. | 148/187 X |
| 4,256,514 | 3/1981 | Pogge | 148/187 X |
| 4,274,909 | 6/1981 | Venkataraman et al. | 29/576 W X |
| 4,333,227 | 7/1982 | Horng et al. | 29/578 X |
| 4,378,630 | 4/1983 | Horng et al. | 148/187 X |
| 4,394,182 | 7/1983 | Maddox | 29/571 X |
| 4,394,196 | 7/1983 | Iwai | 148/187 |

Primary Examiner—G. Ozaki
Attorney, Agent, or Firm—John G. Graham

[57] ABSTRACT

An MOS-type VLSI device is made by a process which provides a planar surface yet maintains geometric control for narrow line widths. The field oxide is recessed by etching the surface of a semiconductor body using thick masking for active device areas. Deposition of field oxide with poor step coverage allows the sidewall to be removed, leaving the top of the field oxide at the same level as the original silicon surface. The thick mask areas are lifted off, resulting in a planar oxide-insulated pattern for formation of transistors or N+ conductive lines.

10 Claims, 9 Drawing Figures

PLANAR FIELD OXIDE FOR SEMICONDUCTOR DEVICES

BACKGROUND OF THE INVENTION

This invention relates to semiconductor devices, and more particularly to the manufacture of VLSI devices having planar surfaces.

In order to manufacture VLSI semiconductor devices such as a 1-Megabit dynamic RAM wherein line resolution is in the range of 2 microns or less, it is preferable that the surface of the semiconductor bar be as smooth and plane as possible, and control of the line width is essential. When the metal conductive strips used for interconnections are as narrow as needed for maximum circuit density, the thinning or discontinuity caused by steps along the surface become major problems. One source of these steps is the thick field oxide used to isolate MOS transistors from one another along the surface. Typically this field oxide is created by thermal oxidation using silicon nitride as a mask, as disclosed in U.S. Pat. No. 4,055,444 issued to G. R. Mohan Rao, assigned to Texas Instruments. While this process has been widely used in making hundreds of millions of memory and microcomputer devices, improvements in surface planarity are preferrable in future VLSI products. A method previously used to produce planar surfaces in manufacture of MOS integrated circuits is that of performing a deep etch prior to growth of field oxide so that the top of the field oxide is level with the original suface. One example of this method is shown in U.S. Pat. No. 4,016,594. A problem with this prior method, however, is the growth of thermal oxide beneath the edges of the silicon nitride oxidation mask. This condition, referred to as moat encroachment, is detrimental to the geometric integrity, especially when line widths are in the range of about two microns as needed for high density devices.

It is the principal object of this invention to provide improved processes for making very large scale integrated circuits, particularly for improving surface planarity in such devices and reducing the geometric effects of moat encroachment. Another object is to provide improved step coverage for interconnection patterns on semiconductor integrated circuits, and to reduce discontinuities in the surface or in surface patterns.

SUMMARY OF THE INVENTION

In accordance with one embodiment of the invention, An MOS-type VLSI device is made by a process which provides a planar surface yet maintains geometric control for narrow line widths. The field oxide is recessed by etching the surface of a semiconductor body using thick masking for active device areas. Deposition of field oxide with poor step coverage allows the sidewall to be removed, leaving the top of the field oxide at the same level as the original silicon surface. This thick mask areas are lifted off, resulting in a planar oxide-insulated pattern for formation of transistors or N+ conductive lines.

BRIEF DESCRIPTION OF THE DRAWINGS

The novel features believed characteristic of the invention are set forth in the appended claims. The invnetion itself, however, as well as other features and advantages thereof, will be best understood by reference to the detailed description which follows, read in conjunction with the accompanying drawings, wherein:

DETAILED DESCRIPTION OF SPECIFIC EMBODIMENT

Referring to FIGS. 1a-1f, a process for making an N-channel, silicon-gate, self aligned, MOS transistor device according to the invention will be described, although it is understood that other types of devices could be fabricated using the features of the invention. The starting material is a slice of P-type monocyrstalline silicon, perhaps four inches in diameter and about 20 mils thick, cut on the <100> plane, of a resistivity of about ten ohm-cm. In the Figures, a wafer or body 10 represents a very small part of the slice, of about one mil or less in lateral dimension, chosen as a representative sample cross section. Typically the transistor to be created in part of a semiconductor device containing many thousands of such transistors on a wafer of about 200 mils on a side.

Figure 1A:
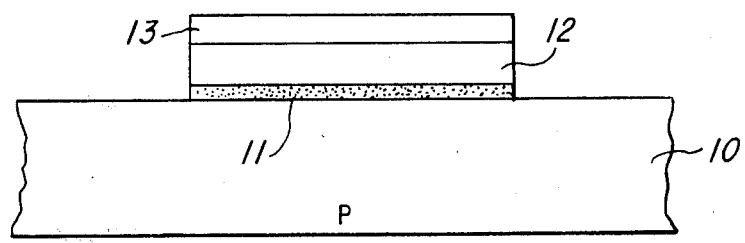
FIGS. 1a-1f are greatly enlarged elevation views in section of a small portion of a semiconductor chip showing an oxide-isolated MOS transistor at successive stages in the manufacturing process according to the invention.

First, after appropriate cleaning, the slice is oxidized by exposing to oxygen in a furnace at an elevated temperature of perhaps 1000° C. to produce an oxide layer 11 of a thickness of 400 Å, as seen in FIG. 1a. Next a thick masking layer 12 of polysilicon or silicon nitride $Si_3N_4$, or metal, of about 2 microns thickness, is formed by a conventional method, e.g., exposing to an atmosphere of dichlorosilane and ammonia in a reactor in the case of silicon nitride. A coating 13 of photoresist is applied to the entire top surface, then exposed to ultraviolet light through a mask which defines the desired pattern, and developed, exposing areas above recessed field oxide is to be produced. Alternatively, instead of ultraviolet light for the photoresist process, electron beam or X-ray lithography may be used to expose the photoresist; X-ray lithography is disclosed in Electronics, Nov. 9, 1978, Page 99 and and electron beam lithography is disclosed in Bell Laboratories Record, March 1976, Page 69-72 and Electronic Products, February 1977, Page 17. The slice is subjected to an anisotropic etch sequence which removes the part of the mask layer 12 not covered by the photoresist 13, then removes the oxide layer 11 if desired.

Figure 1B:
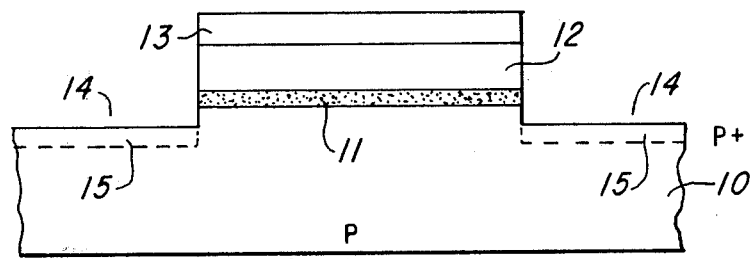

The slice is next subjected to another anisotropic reactive ion or plasma etch step, whereby silicon is removed in areas 14 not covered by the mask 12. It is important that the sidewalls of recessed areas 14 formed by the anisotropic etch as seen in FIG. 1b are vertical and there is little undercut or sloping sidewalls. The depth of this etch is about 7,000 to 12,000 Å, which is much less than the thickness of the layer 12. Although not necessary to the invention, ordinarily channel stops are created by an ion implant using boron as the impurity in regions 15 at the bottom of the recesses 14. Due to the directional nature of this implant, boron will not be introduced into the sidewalls. If a channel stop is desired in the sidewalls a V-groove etchant for silicon such as KOH or tetramethyl ammonium hydroxide can be used to produce a sloped sidewall without undercut.

Figure 1C:
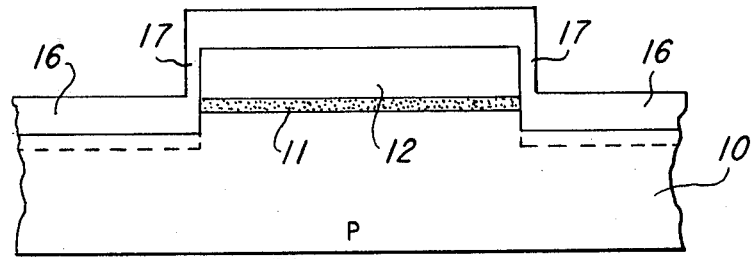

Referring to FIG. 1c, the photoresist 13 is removed, and the following step is formation of field oxide 16, which is done by subjecting the slices to a silicon dioxide deposition process which produces very poor step coverage. For example, evaporation or plasma-enhanced CVD processes, produce much thinner coverage of sidewalls 17 than horizontal surfaces. The top of the thick nitride layer 12 is also covered with deposited oxide. The thickness of this layer 16 is about 12,000 to 15,000 Å, partly extending above the original surface.

Figure 1D:
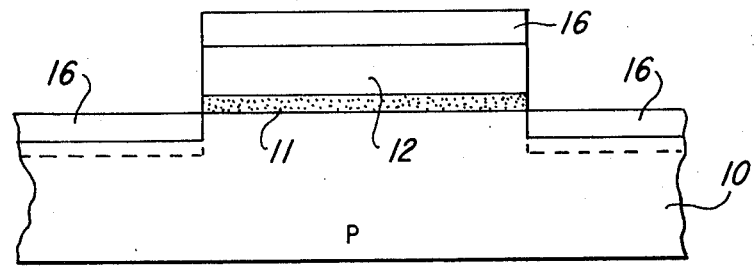

The sidewall oxide 17 is next etched back as seen in FIG. 1d, using an isotropic etch such as HF. Part of the horizontal oxide 16 is removed, but the original thickness is selected so that a plane surface results.

Figure 1E:
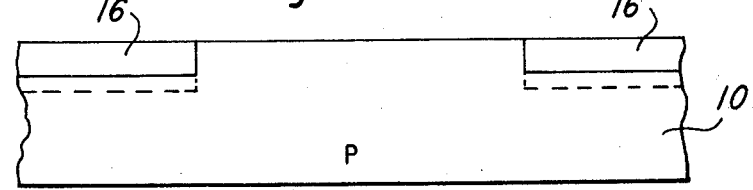
Figure 1F:
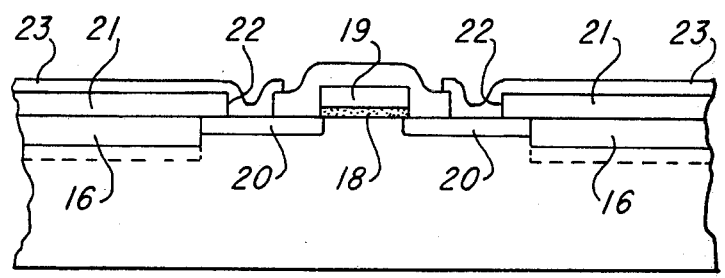

Referring to FIG. 1e, the nitride layer 12 and its underlying oxide layer 11 are removed by etching, as the next step, and another thin silicon oxide layer 18 of about 400 Å is grown over the exposed silicon, as seen in FIG. 1f. A layer of polycrystalline silicon is deposited over the entire slice in a reactor using standard techniques, for example, by decomposition of silane in hydrogen at an elevated temperature. The polysilicon is then patterned using photoresist to form the gate 19 of the transistor.

Using the remaining polysilicon coating and thin oxide 18, as well as the field oxide 16, as a mask, the slice is now subjected to an N+ ion implant step. Arsenic is implanted and then driven into the P-type silicon slice 10 to produce N+ source and drain regions 20 and an N+ gate. The depth of these regions after drive-in is about 5000 Å, more shallow than the field oxide.

Fabrication of the device is continued by depositing a thick layer 21 of multilevel dioxide by a low temperature reaction process using conventional chemical vapor deposition techniques. Subsequently, a photoresist operation opens windows 22 in this oxide layer in areas where metal-to-moat or metal-to-poly contact is to be made. Then, a layer of aluminum is deposited on the entire slice, and selectively etched using photoresist masking to produce the desired pattern of metal strips and contacts 23. Protective oxide is deposited, holes etched to contact bonding pads, and the slice scribed and broken for mounting the individual bars in packages.

Figure 2:
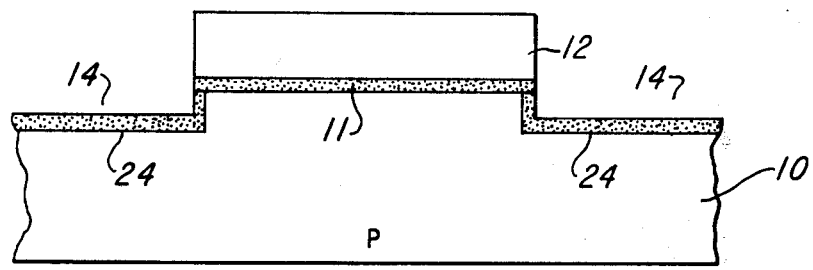
FIGS. 2, 3, and 4 are views corresponding to FIG. 1 for alternative embodiments of the process of the invention.

The deposited oxide 16 is somewhat more porous, compared to the thermal field oxide of the standard process of U.S. Pat. No. 4,055,444, and so the seal against unwanted impurities or contamination may be improved in the process of the invention by growing a thin coating 24 of thermal oxide as seen in FIG. 2. This coating 24 is grown in the recesses 14 after the anisotropic etch referred to above in reference to FIG. 1b. The thickness of the coating 24 is about 400 Å, which will not appreciably alter the shape of the step sidewalls. The layer 16 is deposited over this thermal oxide and the process continues as before. The length of time at high temperature, about 1000° C., needed to grow the thermal oxide coating 24 is quite short compared to that needed to grow thick thermal field oxide as in conventional processes; that is, perhaps twenty minutes compared to ten hours.

Figure 3:
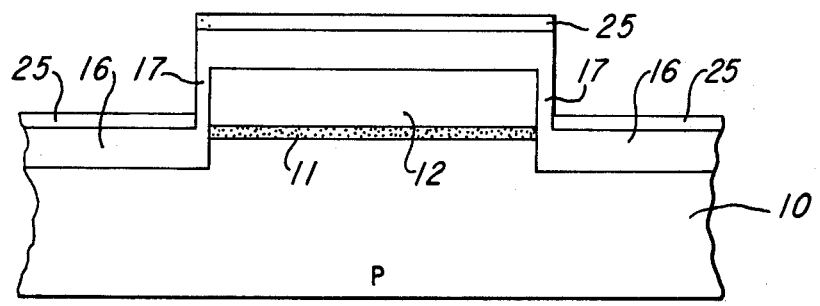

Instead of relying solely on the poor step coverage in the deposition of the oxide 16 in order to preferentially remove the sidewall oxide 17, a silicon layer 25 seen in FIG. 3 may be evaporated into the face of the slice after depositing the oxide 16 but prior to the isotropic etch as discussed above with reference to FIGS. 1c and 1d. Due to the directionality of the evaporation step, there is virtually no sidewall coverage. And other material resistant to hydrogen fluoride etchant may be used instead of silicon for the layer 25. The layer 25 functions as an etch stop so that when the sidewalls 17 are etched, using an etchant which attacks silicon oxide but not silicon, only the sidewalls 17 are removed. Thereafter, the silicon coating 25 may be oxidized, or otherwise eliminated such as by etching. The process is otherwise identical to that of FIGS. 1a–1f.

Figure 4:
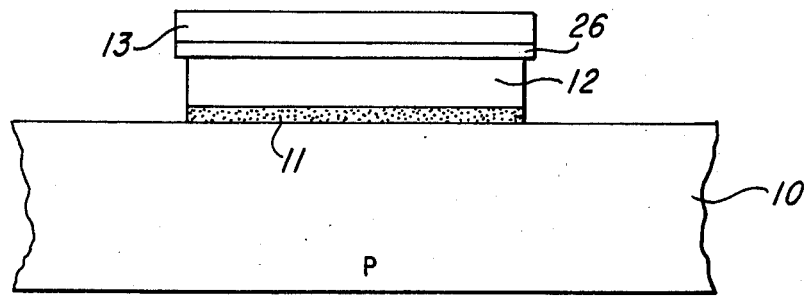

Alternatively, the coverage of the sidewalls 17 can be made even poorer when depositing the oxide 16 by creating an overhang as shown in FIG. 4. A film 26 of silicon nitride is applied on top of the mask layer 12 before applying the photoresist 13. Then after patterning the nitride 26, the etchant which removes the polysilicon 12 will undercut, so when the oxide 16 is deposited very little will adher to the sidewalls.

It is understood that memory of microcomputer devices such as shown in U.S. Pat. Nos. 4,239,993, 4,314,362, 4,074,351 or 3,991,305, all assigned to Texas Instruments, would be made by this process, and so many thousands of the transistors shown would be formed on the chip 10.

While an N-channel MOS process is shown, using a silicon substrate, the invention would be applicable to CMOS, bipolar, etc. Also, other semiconductor and insulating materials could be employed instead of silicon and silicon oxide.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is, therefore contemplated that the appended claims will cover any such modifications or embodiments as fall within the true scope of the invention.

What is claimed:

1. A method of making field oxide for semiconductor devices comprising the steps of:
    applying a pattern of thick mask areas on a face of a semiconductor body,
    etching said face to create recessed field areas in said face where not covered by the mask areas,
    depositing field oxide on said face and on top of the thick mask by a process which provides little coverage of the sidewalls of said thick mask areas,
    etching the field oxide from the sidewalls but leaving thick field oxide in said field areas about level with the original surface of said face, and
    removing said thick mask and the field oxide thereon, leaving a substantialy planar surface.

2. A method according to claim 1 wherein the thickness of the thick mask areas in adequate to provide poor step coverage when depositing field oxide.

3. A method according to claim 2 wherein said etching of the face is substantially anisotropic.

4. A method according to claim 3 wherein the semiconductor body is silicon and the field oxide is silicon dioxide.

5. A method according to claim 4 wherein the thick mask is polysilicon.

6. A method according to claim 5 wherein the step of etching the field oxide is isotropic.

7. A method of making a semiconductor device comprising the steps of:
    applying a thick mask layer on a face of a semiconductor body, etching said face to create a recessed field area in said face surrounding said mask layer, the depth of said recessed field area being equal to the desired thickness of the insulator, depositing field insulator on said face to fill the recesses field area and to cover the top of the thick mask layer, using a deposition process which provides little coverage of the sidewalls of said thick mask layer, etching the field insulator from the sidewalls but leaving thick field insulator in said recessed field areas with a top surface about level with the original surface of said face, removing said thick mask layer and the field insulator thereon, leaving a substantialy planar surface of the face; and forming a circuit element on said face.

8. A method according to claim 7 wherein said etching of the face is substantially anisotropic.

9. A method according to claim 8 wherein the semiconductor body is silicon and the field oxide is silicon dioxide.

10. A method according to claim 9 wherein the thick mask layer is polysilicon.

* * * * *